US007211451B2

(12) United States Patent
Meyer et al.

(10) Patent No.: US 7,211,451 B2
(45) Date of Patent: May 1, 2007

(54) PROCESS FOR PRODUCING A COMPONENT MODULE

(75) Inventors: Thorsten Meyer, Dresden (DE); Gerd Frankowsky, Hohenkirchen-Siegertsbrunn (DE); Harry Hedler, Germering (DE); Barbara Vasquez, Orinda, CA (US); Roland Irsigler, Munich (DE)

(73) Assignee: Infineon Technologies AG, Munich (DE)

( * ) Notice: Subject to any disclaimer, the term of this patent is extended or adjusted under 35 U.S.C. 154(b) by 419 days.

(21) Appl. No.: 10/298,772

(22) Filed: Nov. 18, 2002

(65) Prior Publication Data

US 2003/0109072 A1 Jun. 12, 2003

(30) Foreign Application Priority Data

Nov. 29, 2001 (DE) ................. 101 58 563

(51) Int. Cl.
  H01L 21/66 (2006.01)
  H01L 21/00 (2006.01)
  H01L 23/28 (2006.01)
  H01L 23/498 (2006.01)

(52) U.S. Cl. .................. 438/15; 257/680; 257/787; 257/E23.066; 257/E23.116; 257/E21.525; 716/13; 250/231.13; 438/460; 438/464

(58) Field of Classification Search ............. 257/787, 257/676, 680, E23.066; 716/13; 250/231.13; 438/15, 464, E21.525
See application file for complete search history.

(56) References Cited

U.S. PATENT DOCUMENTS 4,904,610 A  2/1990 Shyr

| 5,032,543 | A | | 7/1991 | Black et al. |
| 5,542,171 | A | * | 8/1996 | Juskey et al. ................. 29/840 |
| 6,389,585 | B1 | * | 5/2002 | Masleid et al. ............... 716/13 |
| 6,417,576 | B1 | * | 7/2002 | Ellenberger et al. ........ 257/787 |

FOREIGN PATENT DOCUMENTS

| DE | 3335 395 A1 | 4/1885 |
| DE | 198 40 226 A1 | 3/2000 |
| EP | 0 611 129 A2 | 8/1994 |
| FR | 2 809 533 A1 | 11/2001 |

OTHER PUBLICATIONS

"Simple Device for Removing Chips from Decal," IBM Technical Disclosure Bulletin, IBM Corp (USA), vol. 30 (No. 11), p. 240-241, (Apr. 1988).

* cited by examiner

*Primary Examiner*—Michael Lebentritt
*Assistant Examiner*—Ron Pompey
(74) *Attorney, Agent, or Firm*—Jenkins, Wilson, Taylor & Hunt, P.A.

(57) ABSTRACT

A process for producing a component module comprising a module carrier and a plurality of components with which contact is made on the latter, comprising the following steps:
  arranging separated components on a surface-adhesive film at a predefined contact-specific spacing from one another,
  embedding the components in a flexible material in order to form a flexible holding frame which holds the components,
  pulling off the film,
  producing contact-making elements on the exposed side of the components,
  performing a functional test of the components and, if necessary, repair and/or replacement of components, and
  fixing and making contact with the components held in the holding frame on the module carrier.

9 Claims, 7 Drawing Sheets

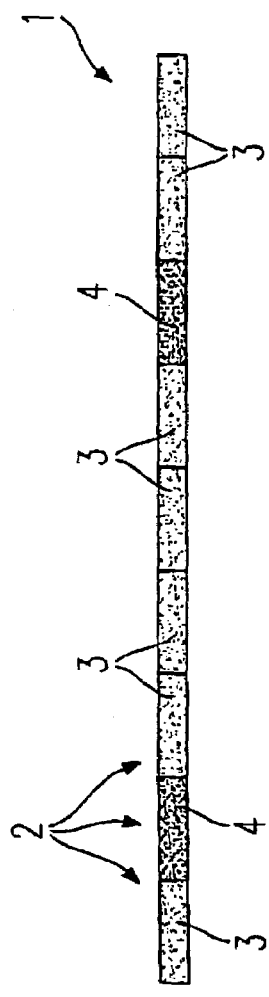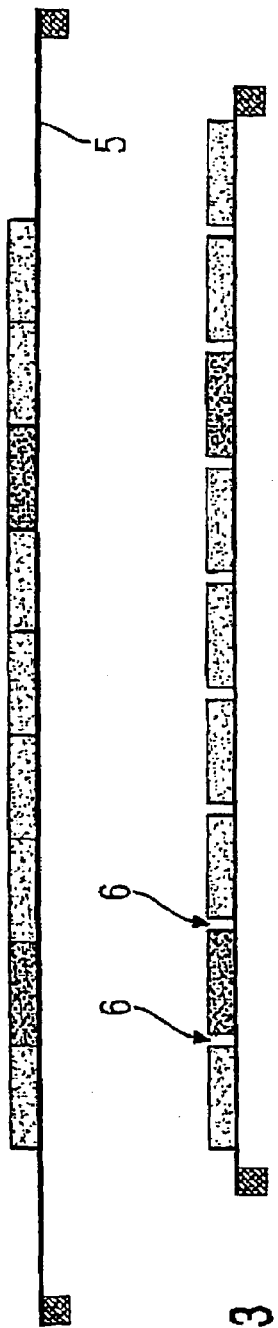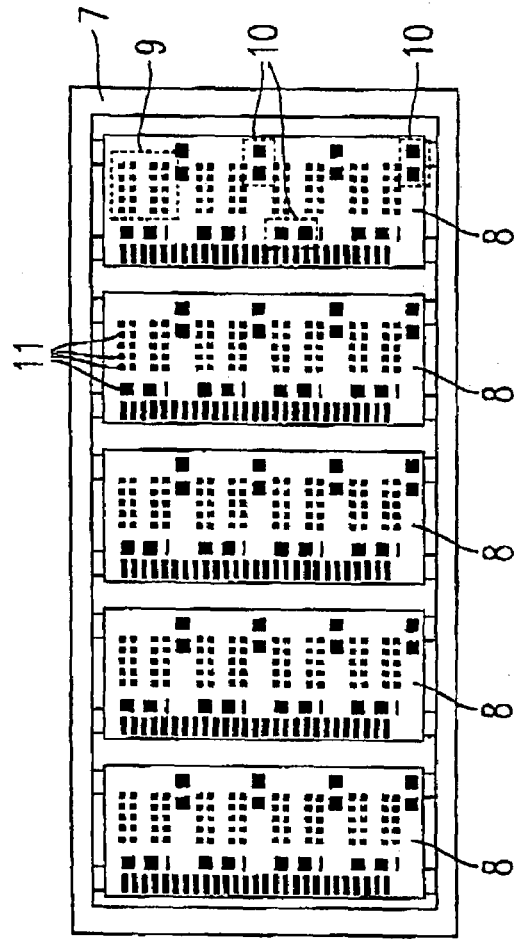

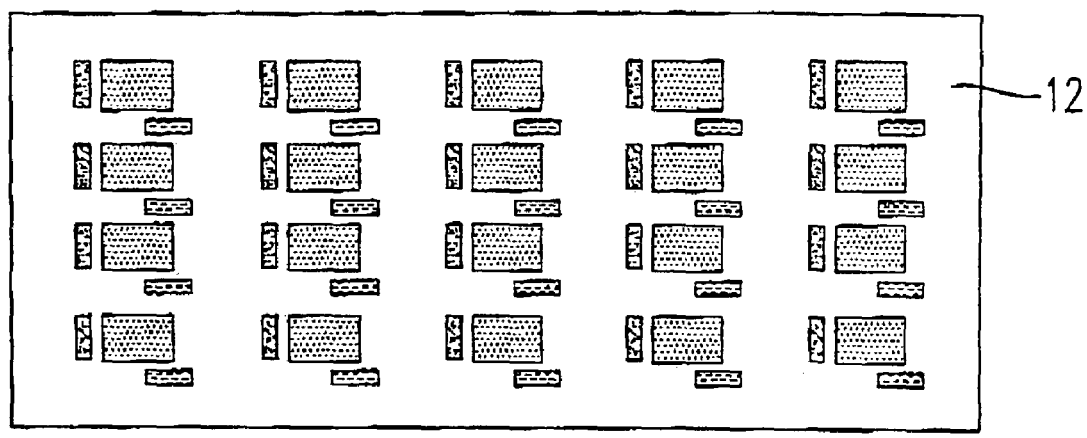
FIG 7
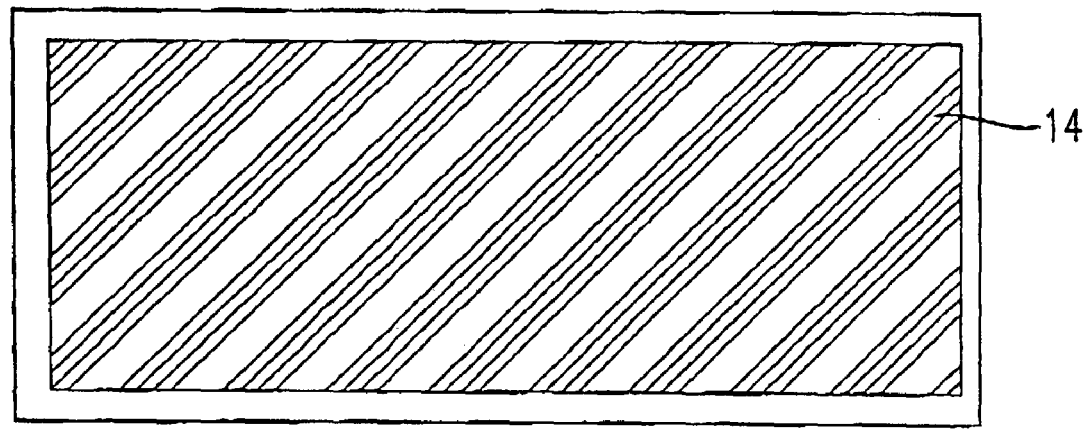
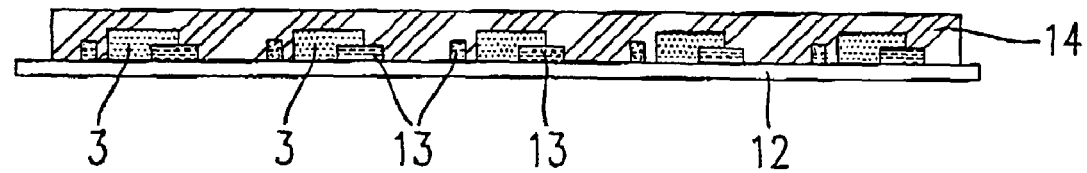
FIG 8

PROCESS FOR PRODUCING A COMPONENT MODULE

TECHNICAL FIELD

The invention relates to a process for producing a component module comprising a module carrier and a plurality of components with which contact is made on the latter.

BACKGROUND ART

Wafer level packaging (WLP), as it is known, is a particularly cost-effective method of producing true chip-size packages, that is to say components of only chip size. These components are distinguished by the fact that the individual chips are soldered or adhesively bonded, with the active side downward, generally to small solder or gold bump contacts on the printed circuit board or the module board, that is to say in general terms the module carrier, and do not have to be housed further (naked chips). In this case, following the mounting of the chip, all the connections of the chip are in the shadow of the silicon, that is to say directly underneath the latter. Outside the memory area, multi-chip modules also demand the assembly of many different components. The drawbacks with WLP housing technology are, firstly, that the components are susceptible to mechanical damage, since the rear of the chip is unprotected. In addition, the spacing of the connections (pitch) has to be reduced in the case of a large number of connections, in order to accommodate them all under the component. This requires expensive module carriers, which do not meet the Standard. One solution to this would be to arrange the connections in a "fan-out" arrangement, that is to say they are located outside the chip shadow. Conventional packages (TSOP, BOC) are therefore constructed in such a way that the connecting contacts are not fitted directly to the chip but to a lead frame/interposer, which is larger than the actual chip and surrounds the latter, so that a standard pitch can be complied with and conventional module carriers can be used. However, the use of the lead frame or an interposer is expensive and complicated.

A further drawback of conventional technologies is that the function of a finished component module, for example a memory module, can be determined only after permanent contact has been made, for example after all the components (that is to say for example memory modules and passive components) have been soldered in. If a chip or another component then does not function, complicated manual repair work is necessary. This also applies to all other multi-chip modules.

The invention is therefore based on the problem of specifying a process for producing a component module which provides a remedy here and eliminates the aforementioned drawbacks.

In order to solve this problem, a process for producing a component module comprising a module carrier and a plurality of components with which contact is made on the latter is provided, comprising the following steps:

- arranging separated components on a surface-adhesive film at a predefined contact-specific spacing from one another,
- embedding the components in a flexible material in order to form a flexible holding frame which holds the components,
- pulling off the film,
- producing contact-making elements on the exposed side of the components,
- performing a functional test of the components and, if necessary, repair and/or replacement of components, and
- fixing and making contact with the components held in the holding frame on the module carrier.

SUMMARY OF THE INVENTION

The process according to the invention firstly proposes arranging the individual components on the adhesive film, said components already being arranged in the way in which they ultimately have to be positioned on the module carrier and have to have contact made with them. They are already arranged at the correct spacing, as based on the contact-making elements on the module carrier. The components are then embedded in a flexible material, for example potted or embedded via a printing process, so that the result is a flexible but sufficiently strong holding frame which surrounds the components and which holds the components. For this purpose, for example silicone is primarily used. After the film has been pulled off, the flexible and somewhat pliable holding frame with the embedded components is present, the components being exposed on their contact-making side as a result of the film having been pulled off. There, in the next step, the contact-making elements are produced which, as necessitated by the holding frame, can also be produced in a fan-out technique, that is to say in the region of the holding frame. In addition to the contact-making elements, the corresponding cross-wiring etc. is of course also produced.

A functional test of the components is then performed, that is to say, in the process according to the invention, there is the possibility of testing all the components, already cross-wired and provided with contact elements, of the component module ultimately to be produced for its serviceability before its actual fixing and making of contact on the module carrier. The functional test is carried out in any case after the components forming an individual module have been fitted, that is to say the component module is complete. If it transpires that one or another component, for example a memory chip, does not function then there is either the possibility of repairing it in the holding frame itself or replacing it, which is possible in a straightforward manner, since it can be removed from the flexible holding frame by bending the latter slightly and can be replaced by a serviceable component, on which the contact-making elements and, if appropriate, the cross-wiring then still has to be produced in a separate step. In any case, there is the possibility of a preceding functional test with the possibility of significantly simpler rectification of any defects.

After the functional test has been performed and any replacement or any repair has been carried out, the fixing and making of contact with the components held in the holding frame is ultimately carried out on the module carrier in a known way.

The components used can be both active components, such as memory chips (e.g. DRAM's) and any passive component.

It is expedient if the film used is a double-sided adhesive film, which is firstly bonded to one or more module carriers, after which the components are bonded to the film on the basis of their associated contact-making positions on the module carrier, which determine the contact-specific spacing, and after which the film is pulled off from the module carrier or carriers. In this configuration of the invention, it is advantageous that the automatic pick-and-place device can already perform the fitting in relation to the module carrier located underneath without any doubt, that is to say the fitting can be carried out exactly in accordance with the predefined pitch, based on fixing points on the module carrier. After the then populated film has been pulled off from the module carrier or carriers, the components are then embedded in the flexible material.

It is particularly expedient if components tested as serviceable in a preceding functional test, be they active or passive, are bonded to the film. This means that, from the start, use is made of components already tested as serviceable, so that the fault level of unserviceable components ultimately provided after the embedding of the components in the holding frame becomes extremely low. However, there may still be faulty components, which have been damaged in the context of the preceding process and which can then be found in the functional test performed before the fixing to the module carrier. This configuration of the invention therefore permits the production of a "known good wafer" in the form of the components embedded in the holding frame.

Furthermore, provision can be made for the contact elements and possibly cross-wiring to be produced outside the silicon on the flexible holding frame. The contact-making elements and the cross-wiring can also be arranged in a fan-out arrangement in the region of the holding frame, that is to say they are located outside the actual component shadow, therefore not directly underneath the component but offset laterally in relation to the latter.

In order to fix and make contact with the components at the contact-making positions on the module carrier, separate contact-making elements are expediently produced on the latter. If passive components are also provided, then the module carrier can, for example, first be provided with a deposit of solder at the installation spaces of the passive components, using solder paste in stencil printing and subsequent reflow, in order to compensate for any height differences in relation to the active components, for example the memory components. Then, again using stencil printing, solder paste can be applied to the module at all installation spaces, that is to say at all contact-making positions, after which the components are soldered.

It is further expedient if, in the event of integration of components for a plurality of module carriers in a common holding frame, the holding frame is divided up, before or after the performance of the functional test, in order to form module-specific frame sections. According to this configuration of the invention, therefore, a component blank is produced which contains a plurality of component groups for a plurality of module carriers. At a given time, either before or after the performance of the functional test, this component blank is divided up, primarily sawn up, into the individual module components or frame sections, each of which is assigned to a module carrier.

In addition to the process, the invention further relates to a component module produced by the process of the type described.

BRIEF DESCRIPTION OF THE DRAWINGS

Further advantages, features and details of the invention emerge from the exemplary embodiment described in the following text and by using the drawings, in which:

FIGS. 1–17 show the different process steps starting from a standard front end wafer as far as the finished component module.

DETAILED DESCRIPTION OF THE INVENTION

Figure 5:
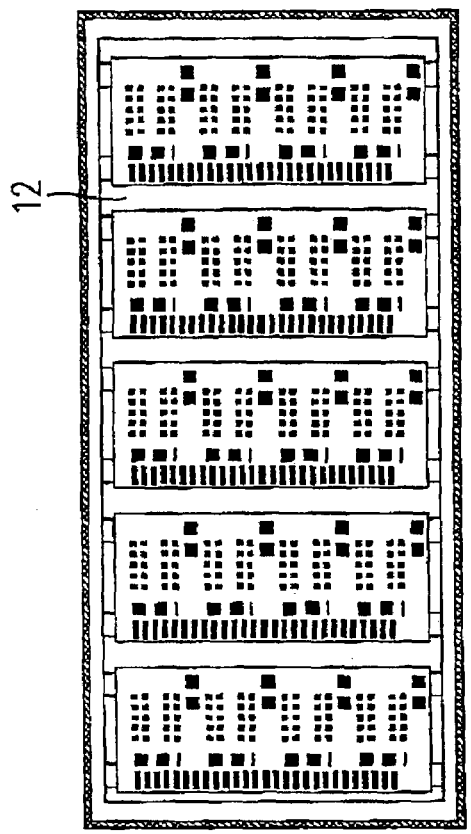

FIG. 1 shows a standard front end wafer 1, which has been finally processed in the front end. It comprises as many as possible and as small as possible chips 2, of which the chips 3 are serviceable and the chips 4 are faulty. This can be determined in a straightforward manner in a functional test which follows the front end fabrication and which is expediently performed when the chips 2 are separated.

As FIG. 2 shows, the wafer 1 is then bonded onto a surface-adhesive film 5, a sawing film, as it is known, and sawn up in accordance with FIG. 3 in order to separate the chips 2. After the sawing, the chips are separated from one another by narrow sawing tracks 6. For example, the functional test of the individual chips, mentioned above, can then be performed.

FIG. 4 shows a module carrier frame 7 in which 5 module carriers 8 are inserted in the example shown. Provided on each of the module carriers 8 are holders 9, for example for active components, and holders 10, for example for passive components, corresponding contact-making positions 11, which are subsequently further fitted with contact elements, likewise being provided on the module carrier. The entirety of the module carrier 8 is referred to as a module blank.

In the step according to FIG. 5, a double-sided adhesive film 12 is then bonded to the module carrier 8 or the module blank within the context of a lamination step. This film is expediently transparent, so that markings located on the module carrier and which are required in the context of subsequent component fitting are visible.

Figure 6:
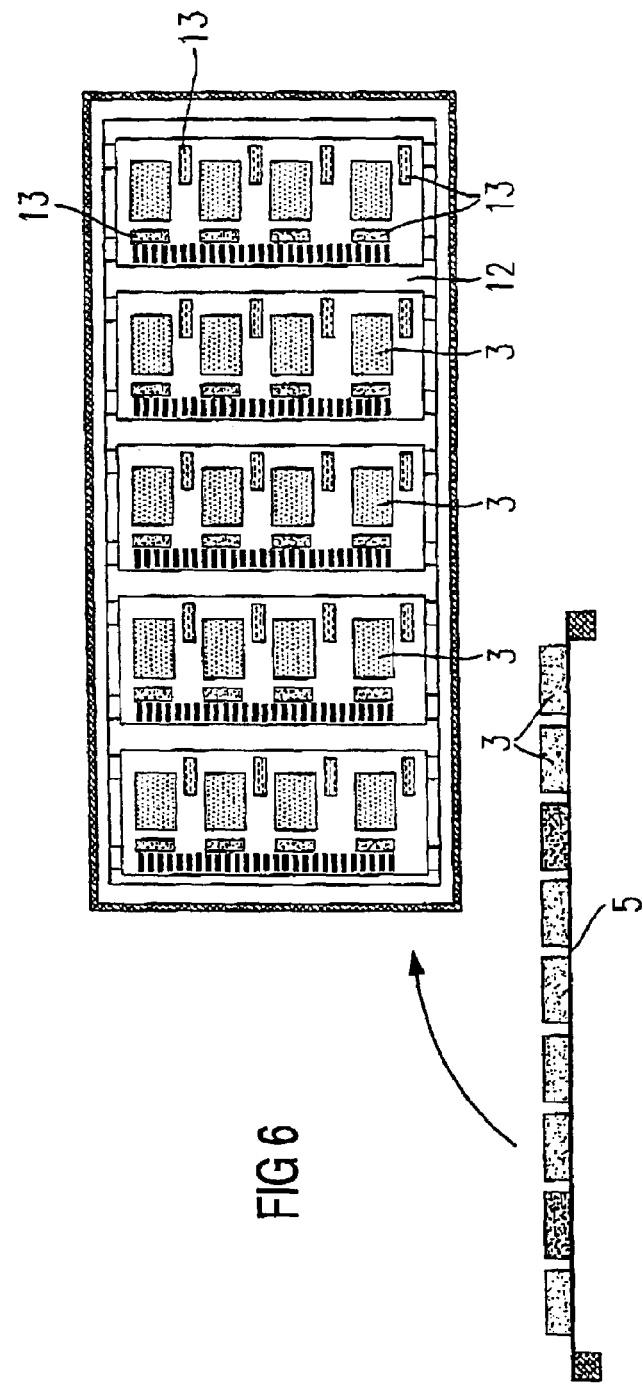

In the step according to FIG. 6, the components are then bonded onto the film 12. These components are firstly the serviceable chips 3 separated from the wafer 1, which are taken off the film 5 by means of a pick-and-place automat and are bonded onto the film 12. Furthermore, passive components 13 are bonded onto the film 12, which is likewise carried out by using a pick-and-place automat. The chips 3 and the components 13 are bonded precisely at the positions on the film 12 which are assigned to them on the respective module carrier 8. In this way, complete individual module sections comprising the respective components are then produced, but the components are not undetachably connected to the module carrier.

Figure 9:
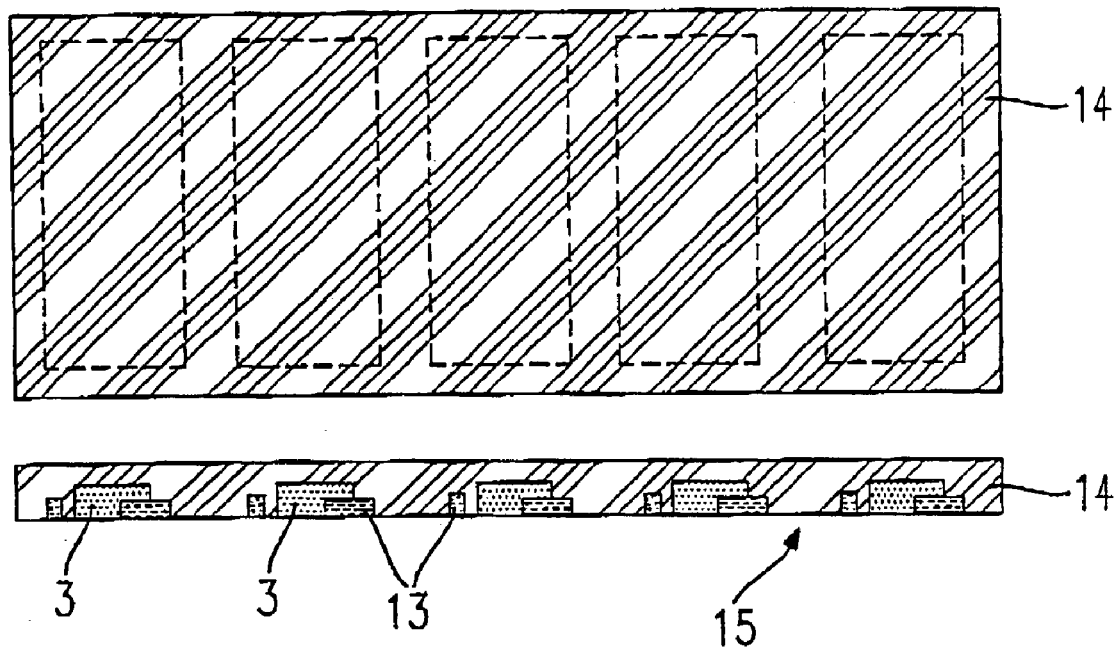

In the step according to FIG. 7, the film 12 fitted with the chips 3 and the other components 13 is then pulled off the module carriers. Then—see FIG. 8—the chips 3 and the other components 13 are embedded in a flexible material, primarily silicone, for example by means of potting or else by printing the material on. The upper part of FIG. 8 illustrates a plan view, the lower part shows a sectional view. It can be seen clearly that the chips 3 and the components 13 are completely embedded. After the embedding material has been cured, the film 12 is pulled off, see FIG. 9. The material 14 forms a holding frame 15, in which the chips 3 and the components 13 are held. This is a flexible holding frame, which has a certain pliability, which will be discussed further below.

Figure 10:
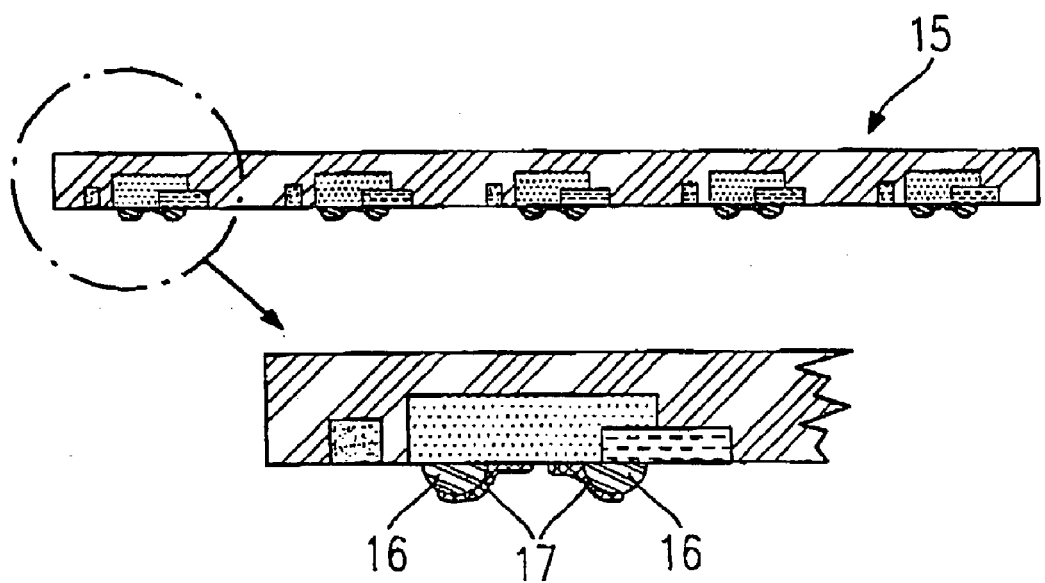
Figure 11:
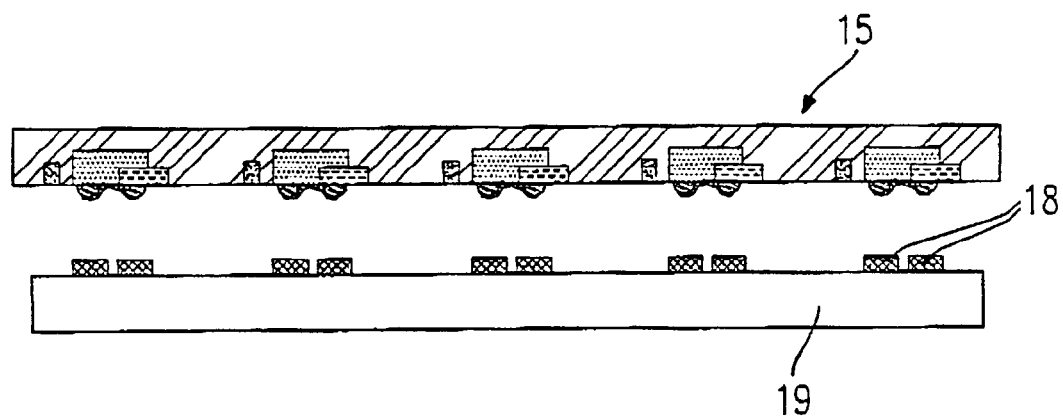

In the step according to FIG. 10, the production of contact-making elements 16 and any cross-wiring 17 is then carried out on the contact-making sides, now exposed, of the chips 3 and the components 13, in a step similar to a "wafer level assembly", although this is not a true wafer here. The contact-making elements and the cross-wiring can also be arranged in a fan-out arrangement in the region of the holding frame 15, that is to say they are located outside the actual component shadow, that is to say not directly underneath the component, but offset laterally with respect to the latter. FIG. 10 shows, firstly in a side view, the complete holding frame 15, as known from FIG. 9, and a detail thereof in an enlarged illustration. Following the production of these interconnect elements, as FIG. 11 shows, a test is carried out of all the chips 3 and components 13, which are still arranged in the holding frame 15. For this purpose, contact is made between all the chips 3 and components 13, via their interconnect elements produced previously, and contact points 18 on a test board 19.

Figure 12:
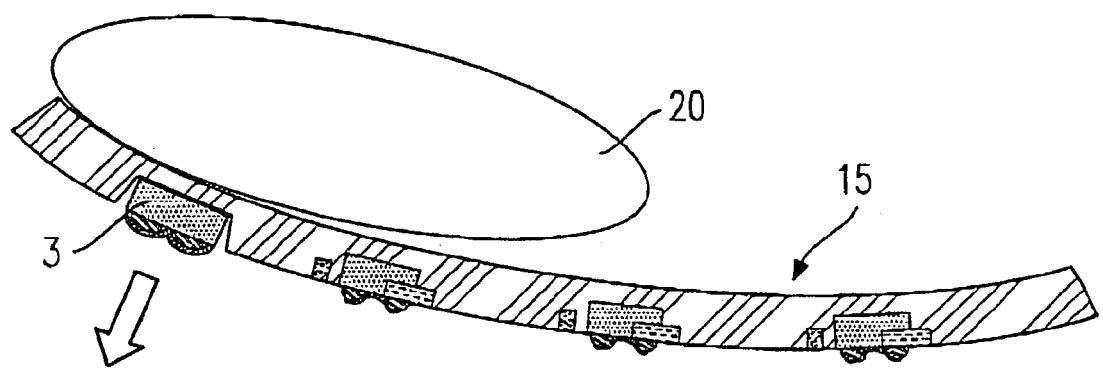

If, during this functional test, it transpires that, for example, a chip 3 nevertheless does not function, then a repair or replacement step is carried out, as FIG. 12 shows. Here, the flexible holding frame is bent up somewhat, which can be done for example by placing the holding frame 15 on a curved mating piece 20. The holding frame 15 opens somewhat in the region where it encloses the component or the chip 3 in the example shown, so that said chip can be removed from the pocket-like holder and a functioning chip or a functioning component can be inserted there. It is then, if appropriate, merely necessary for the contact-making elements and any cross-wiring to be produced on the replacement chip or on the replacement component.

Figure 13:
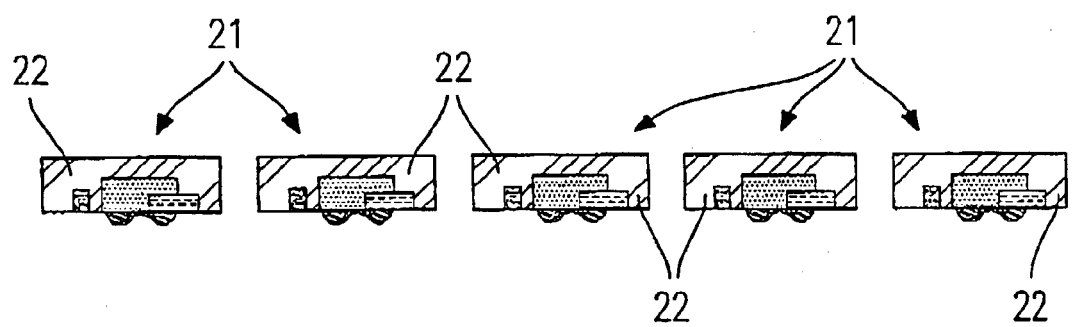

As FIG. 13 shows, after it has been ensured that all the components and chips function, that is to say that all the individual module-specific component groups are serviceable, the individual subassemblies are then separated by dividing up the holding frame 15. In the example shown, a total of five individual component groups 21 are obtained, whose components and chips are still embedded in a holding frame section 22, where they also ultimately remain.

Figure 14:
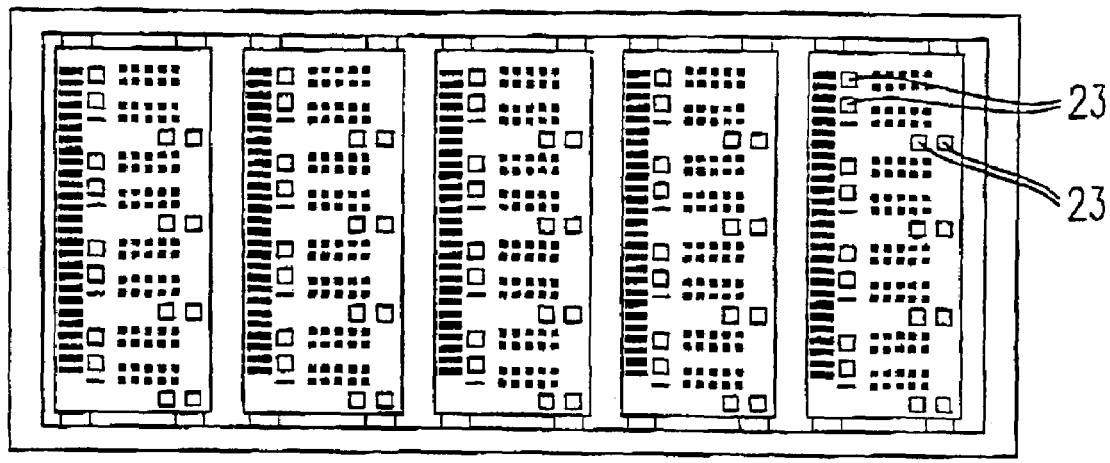
Figure 15:
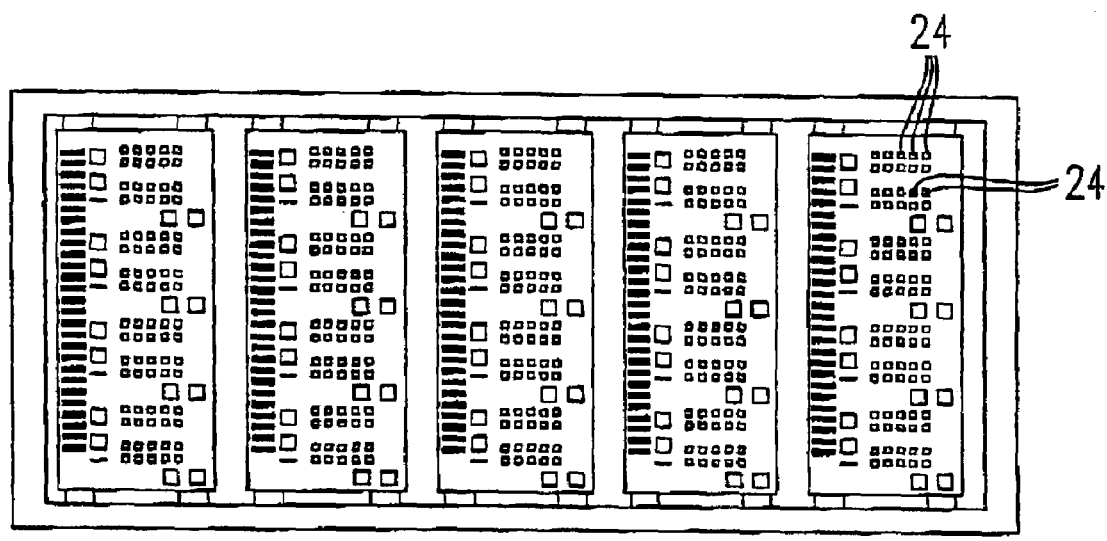

In the step according to FIG. 14, a solder deposit 23 is then produced by stencil printing with solder paste and subsequent reflow at the installation spaces of the passive components 13, in order to compensate for any height difference in relation to the chips 3. Then, as FIG. 15 shows, solder paste 24 is applied to the module carrier in a renewed screen print on all the contact positions.

Figure 16:
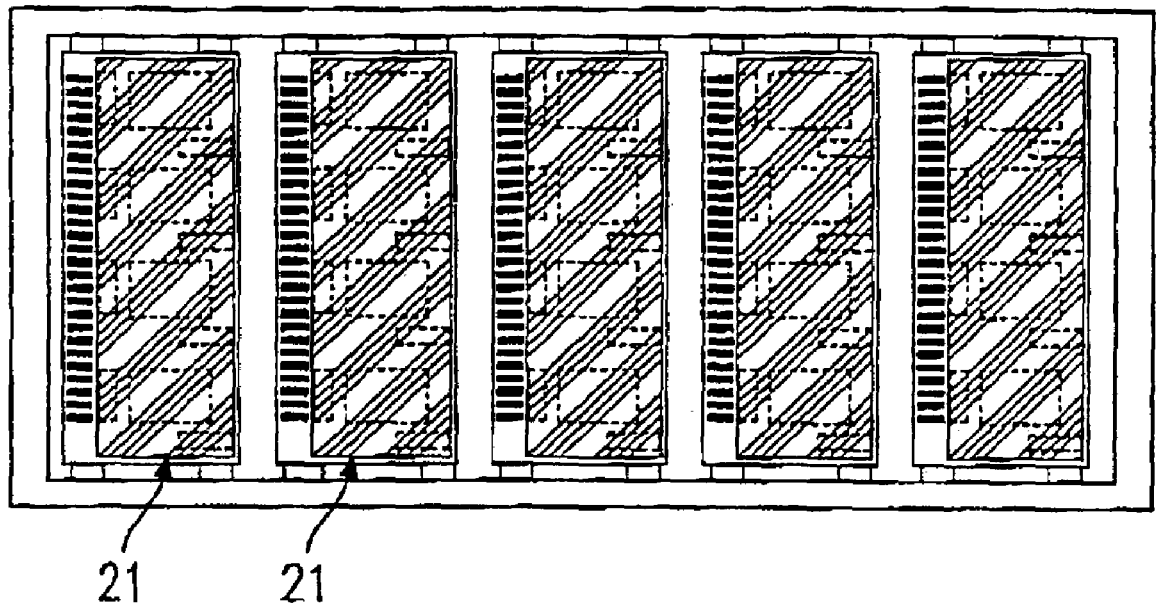
Figure 17:
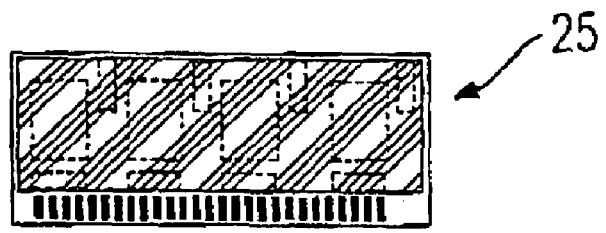

In the step according to FIG. 16, the separated component groups 21 are then applied to the module carrier 8. The components and the chips are then soldered to the respective module carrier or the contact elements there in a reflow process. In the step according to FIG. 17, the possibly required processing of the rear side of the module carriers is finally carried out, and finally the separation of the component modules 25 from the module carrier frame 7.

What is claimed is:

1. A method for producing a component module comprising a module carrier and a plurality of components with which contact is made on the latter, the method comprisings:
   (a) arranging separated components on a surface-adhesive film at a predefined contact-specific spacing from one another;
   (b) embedding the components in a flexible material in order to form a flexible holding frame which holds the components, the flexible holding frame providing a pocket-like holder for each of the components embedded in the flexible holding frame and the flexible material having a pliability so that the flexible holding frame can be bent to remove an individual component of the components embedded in the flexible holding frame from its pocket-like holder;
   (c) pulling off the film;
   (d) producing contact-making elements on the exposed side of the components;
   (e) determining which of the components embedded in the flexible holding frame is a non-functional component by performing a functional test of the components;
   (f) removing the non-functional component from its pocket-like holder by bending the flexible holding frame so that the flexible holding frame opens in an area where the flexible holding frame encloses the non-functional component;
   (g) repairing the non-functional component and inserting the repaired component in the relevant pocket-like holder, or inserting a new component in the pocket-like holder of the removed non-functional components; and
   (h) fixing and making contact with the components held in the holding frame on the module carrier.

2. The method as claimed in claim 1, wherein the components used are both active and passive components.

3. The method as claimed in claim 1, wherein the film used is a double-sided adhesive film, which is firstly bonded to one or more module carriers, after which the components are bonded to the film on the basis of their associated contact-making positions on the module carrier, which determine the contact-specific spacing, and after which the film is pulled off from the module carrier or carriers.

4. The method as claimed in claim 1, wherein only components tested as serviceable in a preceding functional test are bonded to the film.

5. The method as claimed in claim 1, wherein the components are potted or printed with the material in order to embed them.

6. The method as claimed in claim 1, wherein the material used is silicone.

7. The method as claimed in claim 1, wherein the contact elements and, if appropriate, cross-wiring are produced outside the silicon, on the flexible holding frame.

8. The method as claimed in claim 1, wherein, in order to fix and make contact with the components at the contact-making positions on the module carrier, contact-making elements are produced.

9. The method as claimed in claim 1, wherein, in the event of integration of components for a plurality of module carriers in a common holding frame, the holding frame is divided up, before or after the performance of the functional tests, in order to form module-specific frame sections.

* * * * *